US009214626B2

(12) United States Patent
Kakushima et al.

(10) Patent No.: US 9,214,626 B2
(45) Date of Patent: Dec. 15, 2015

(54) RESISTANCE CHANGE MEMORY DEVICE

(71) Applicants: TOKYO INSTITUTE OF TECHNOLOGY, Tokyo (JP);
TOSHIBA MATERIALS CO., LTD., Yokohama-shi, Kanagawa (JP)

(72) Inventors: Kuniyuki Kakushima, Tokyo (JP);
Chunmeng Dou, Tokyo (JP); Parhat Ahmet, Tokyo (JP); Hiroshi Iwai, Tokyo (JP); Yoshinori Kataoka, Kawasaki (JP)

(73) Assignees: TOKYO INSTITUTE OF TECHNOLOGY, Tokyo (JP);
TOSHIBA MATERIALS CO., LTD., Yokohama-Shi (JP)

( * ) Notice: Subject to any disclaimer, the term of this patent is extended or adjusted under 35 U.S.C. 154(b) by 0 days.

(21) Appl. No.: 14/384,281

(22) PCT Filed: Mar. 12, 2013

(86) PCT No.: PCT/JP2013/056826
§ 371 (c)(1),
(2) Date: Sep. 10, 2014

(87) PCT Pub. No.: WO2013/137262
PCT Pub. Date: Sep. 19, 2013

(65) Prior Publication Data
US 2015/0083987 A1 Mar. 26, 2015

(30) Foreign Application Priority Data
Mar. 14, 2012 (JP) .................. 2012-057871

(51) Int. Cl.
*H01L 45/00* (2006.01)
(52) U.S. Cl.
CPC ............ *H01L 45/08* (2013.01); *H01L 45/1233* (2013.01); *H01L 45/1253* (2013.01); *H01L 45/145* (2013.01); *H01L 45/146* (2013.01); *H01L 45/1633* (2013.01)

(58) Field of Classification Search
CPC .... H01L 45/08; H01L 45/145; H01L 45/1233
See application file for complete search history.

(56) References Cited

U.S. PATENT DOCUMENTS

| 8,476,614 B2 | 7/2013 | Sumino et al. |
| 2009/0257271 A1 | 10/2009 | Noshiro |

(Continued)

FOREIGN PATENT DOCUMENTS

| CN | 101159314 A | 4/2008 |
| JP | 2005-285451 A | 10/2005 |

(Continued)

OTHER PUBLICATIONS

H. Y. Lee et al., "Low Power and High Speed Bipolar Switching with A Thin Reactive Ti Buffer Layer in Robust $HfO_2$ Based RRAM" Technical Digest of International Electron Devices Meeting (IEDM) 2008, p. 297-300.
W. Kim et al., "Forming-Free Nitrogen-Doped $AlO_x$ RRAM with Sub-µA Programming Current", 2011 Symposium on VLSI Technology Digest of Technical Papers, p. 22-23.

(Continued)

*Primary Examiner* — Mark Prenty
(74) *Attorney, Agent, or Firm* — Foley & Lardner LLP

(57) ABSTRACT

A resistance change memory device with a high ON/OFF radio can be provided according to an embodiment includes a first electrode containing a first element, a resistance change layer provided on the first electrode and containing an oxide of the first element, an oxygen conductive layer provided on the resistance change layer, containing a second element and oxygen, having oxygen ion conductivity, and having a relative permittivity higher than a relative permittivity of the resistance change layer, and a second electrode provided on the oxygen conductive layer. The resistance change layer undergoes dielectric breakdown earlier than the oxygen conductive layer when a voltage between the first electrode and the second electrode is continuously increased from zero.

12 Claims, 14 Drawing Sheets

(56) References Cited

U.S. PATENT DOCUMENTS

| | | | |
|---|---|---|---|
| 2011/0095255 | A1 | 4/2011 | Sumino et al. |
| 2011/0176351 | A1 | 7/2011 | Fujitsuka et al. |
| 2012/0044749 | A1 | 2/2012 | Muraoka et al. |
| 2012/0199805 | A1 | 8/2012 | Sorada et al. |
| 2013/0299765 | A1 | 11/2013 | Sumino et al. |
| 2015/0083987 | A1* | 3/2015 | Kakushima et al. ............... 257/4 |

FOREIGN PATENT DOCUMENTS

| | | |
|---|---|---|
| JP | 2010-028001 A | 2/2010 |
| JP | 2010-251352 A | 11/2010 |
| JP | 2011-091325 A | 5/2011 |
| JP | 2011-146111 A | 7/2011 |
| KR | 2008-0015049 A | 2/2008 |
| WO | WO 2010/073897 A1 | 7/2010 |
| WO | WO 2011/052239 A1 | 5/2011 |
| WO | WO 2012/023269 A1 | 2/2012 |

OTHER PUBLICATIONS

Tran, X.A. et al., A High Yield HfOx-Based Unipolar Resistive RAM Employing Ni Electrode Compatible With Si-Diode Selector for Crossbar Integration, IEEE Electron Device Letters, Feb. 4, 2011, vol. 32, No. 3, pp. 396-398.

Nicollian, P.E., Physics of Trap Generation and Electrical Breakdown in Ultra-Thin SiO2 and SiON Gate Dielectric Materials, Ph.D. Dissertation, University of Twente, Aug. 31, 2007.

Raghavan, N. et al., Evidence for Compliance Controlled Oxygen Vacancy and Metal Filament Based Resistive Switching Mechanisms in RRAM, Microelectronic Engineering, Apr. 3, 2011, vol. 88, pp. 1124-1128.

Tran, X.A. et al., Self-Rectifying and Forming-Free Unipolar HfOx Based-High Performance RRAM Built by Fab-Available Materials, IEEE International Electron Devices Meeting (IEDM), Dec. 7, 2011, pp. 713-716.

\* cited by examiner

LOW RESISTANCE STATE

HIGH RESISTANCE STATE

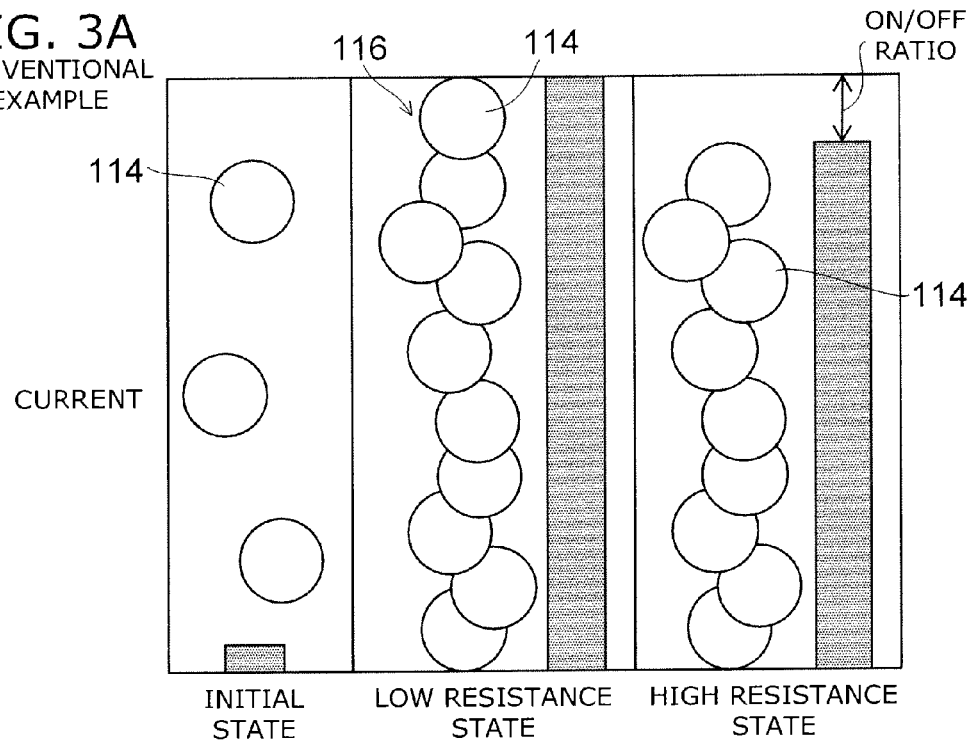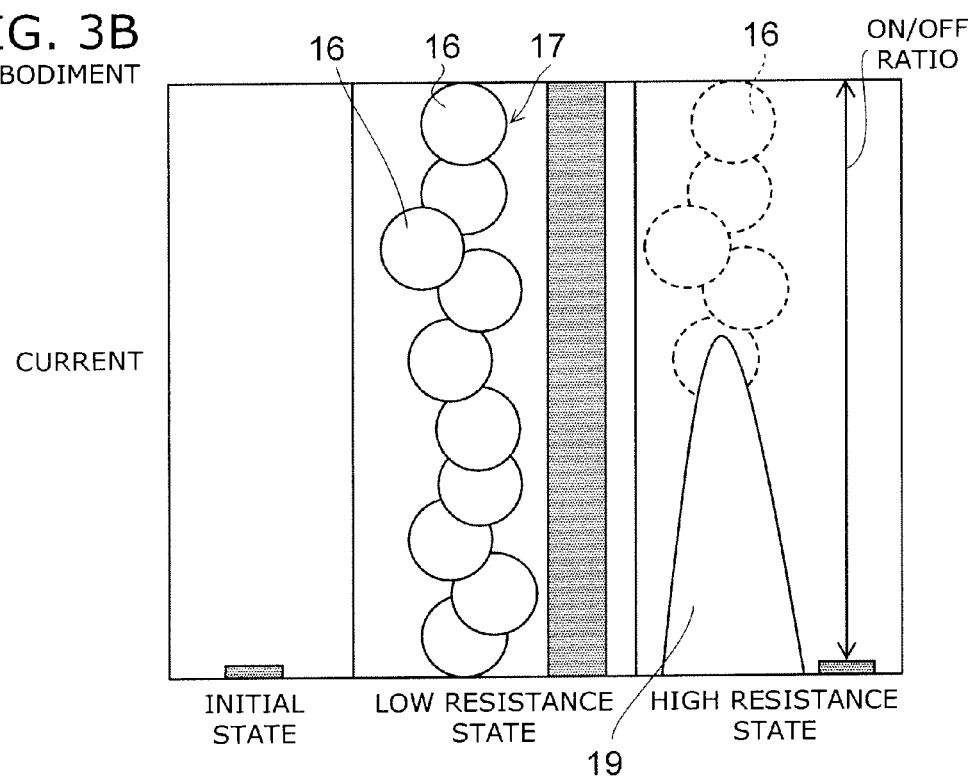

FIRST EXAMPLE

FIRST COMPARATIVE EXAMPLE

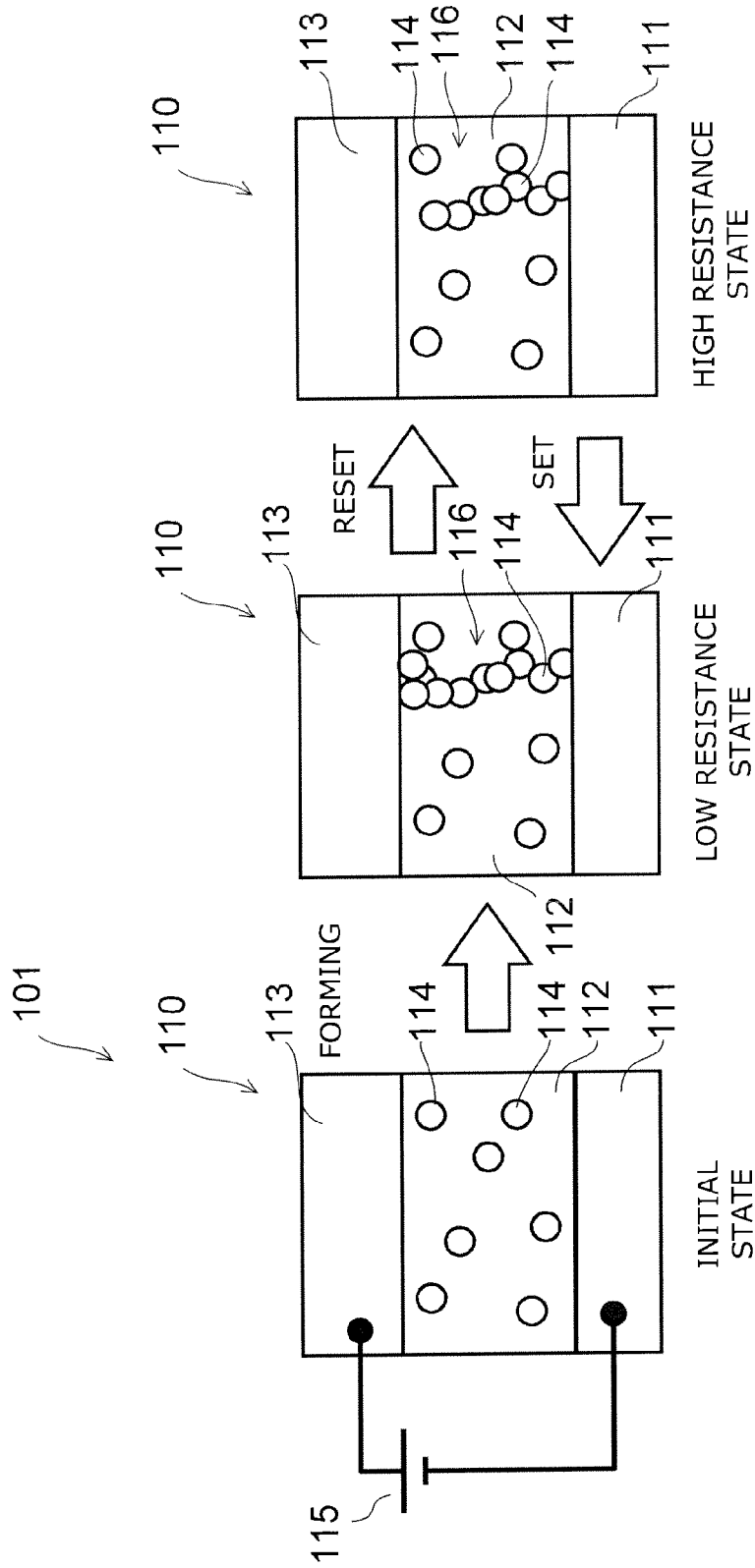

RESISTANCE CHANGE MEMORY DEVICE

TECHNICAL FIELD

This invention relates to a resistance change device.

BACKGROUND ART

These days, a phenomenon in which, when a voltage is applied to some kinds of metal oxide, the electric resistance value of the metal oxide changes between values at two levels has been found, and a memory device utilizing this phenomenon is proposed. Such a memory device is called a resistance change memory device (resistance random access memory; ReRAM).

FIGS. 14A to 14C are diagrams schematically showing operations of a conventional resistance change memory device. FIG. 14A shows an initial state, FIG. 14B shows a low resistance state, and FIG. 14C shows a high resistance state.

FIG. 15 is a graph illustrating the I-V characteristics of the conventional resistance change memory device, with the voltage on the horizontal axis and the current on the vertical axis.

As shown in FIG. 14A, in a memory cell 110 of a conventional resistance change memory device 101, a lower electrode 111, a resistance change layer 112, and an upper electrode 113 are stacked in this order. A power supply circuit 115 is provided in the resistance change memory device 101, and is connected between the lower electrode 111 and the upper electrode 113. The resistance change layer 112 is made of a metal oxide, and includes a large number of oxygen-deficient portions 114. The oxygen-deficient portion 114 is a portion where the concentration of oxygen is relatively low and the concentration of metal is relatively high. In the initial state, the oxygen-deficient portions 114 are randomly scattered in the resistance change layer 112, and the resistance change layer 112 has a high electric resistance value. In FIG. 15, the initial state is shown as state $S_0$.

As shown as operation $M_1$ in FIG. 15, when the power supply circuit 115 applies a voltage at which the upper electrode 113 becomes a positive pole and the lower electrode 111 becomes a negative pole (a positive voltage) between the lower electrode 111 and the upper electrode 113, a current path formed of oxygen-deficient portions 114 is formed in the resistance change layer 112 as shown in FIG. 14B. The current path is referred to as a "filament," and the operation of forming a filament 116 in the resistance change layer 112 in the initial state is referred to as "forming." Thereby, the resistance change layer 112 transitions to a low resistance state (LRS) and a large current flows, as shown as state $S_1$ in FIG. 15. The power supply circuit 115 is provided with a current limiting mechanism, and the current flowing through the memory cell 110 is limited to 5 mA or less, for example.

Next, as shown as operation $M_2$ in FIG. 15, the voltage applied between the lower electrode 111 and the upper electrode 113 is continuously decreased to a negative voltage. Consequently, when the voltage has reached a prescribed negative value as shown as state $S_2$ in FIG. 15, the resistance change layer 112 transitions to a high resistance state (HRS) and the flowing current is reduced. This operation is referred to as "reset." It is presumed that, in the high resistance state, oxygen-deficient portions 114 are dislocated from one end portion of the filament 116 as shown in FIG. 14C.

After that, as shown as operation $M_3$ in FIG. 15, when the voltage is brought close to zero continuously, the I-V characteristics change in accordance with Ohm's law while the resistance change layer 112 maintains the high resistance state. Then, when the voltage increases across zero and has reached a certain positive value, the resistance change layer 112 returns to the low resistance state and the current increases discontinuously, as shown as state $S_3$ in FIG. 15. This operation is referred to as "set." At this time, it is presumed that the missing portions of the filament 116 are restored and continuously arranged between the lower electrode 111 and the upper electrode 113 again, as shown in FIG. 14B.

After that, by repeating operations $M_2$ and $M_3$, resetting and setting may be repeated to switch between the low resistance state and the high resistance state arbitrarily. In this way, two values of information can be written on one memory cell. The written information can be read by detecting the magnitude of the current flowing when a prescribed read voltage, for example a voltage of −0.1 V, is applied between the electrodes.

However, such a conventional resistance change memory device has a problem that the ON/OFF ratio of the electric resistance value, that is, the value of the ratio of the magnitude of the current flowing in the lime of the low resistance state to the magnitude of the current flowing in the time of the high resistance state when a prescribed read voltage is applied, is low. In the example shown in FIG. 15, the ON/OFF ratio is approximately $10^1$. In this case, when ten memory cells are connected in series and a current is passed, even if all the memory cells are in the high resistance state, a current substantially equal to that when one memory cell is in the low resistance state flows, and it is difficult to find the value stored. Thus, if the ON/OFF ratio is low, it is difficult to achieve higher integration of memory cells. In resistance change memory cells of the conventional system in which a filament is formed in a metal oxide, the ON/OFF ratio is approximately $10^2$ at highest.

Furthermore, in the conventional resistance change memory device, it is necessary to perform forming on the resistance change layer in the initial state. The forming is based on the hope that a filament will be formed in the resistance change layer incidentally; thus, the control is difficult.

Non-Patent Document 1 discloses a technology in which a resistance change layer is configured to be a thin film to facilitate the formation of a filament and eliminate the need for forming. Non-Patent Document 1 has a description in which, in a (TiN/TiO$_x$/HfO$_x$/TiN) stacked structure, the forming voltage can be lowered as the film thickness of the HfO$_x$ film, which is the resistance change layer, is reduced, and the forming voltage can be made substantially zero when the film thickness of the HfO$_x$ film is set to 3 nm or less.

Non-Patent Document 2 discloses a technology in which the formation of a filament is made easier by adding a different kind of element into the resistance change layer to introduce a defect. Non-Patent Document 2 has a description in which, in an (Al/AlO:N/Al) stacked structure, the forming voltage can be made equal to the set voltage by introducing nitrogen into the (AlO:N) film, which is the resistance change layer.

However, the technologies disclosed in Non-Patent Documents 1 and 2 can only reduce the forming voltage to a level substantially equal to the set voltage or less, and cannot increase the ON/OFF ratio. Thus, it is still difficult to achieve higher integration of memory cells.

CITATION LIST

Non-Patent Documents

[Non-Patent Document 1] H. Y. Leel, et al., Technical Digest of International electron Devices Meeting (IEDM) 2008, p. 297-300

[Non-Patent Document 2] Wanki Kim, et al., 2011 Symposium on VLSI Technology Digest of Technical Papers. p. 22-23

SUMMARY OF THE INVENTION

Problem to be Solved by the Invention

The purpose of the invention is to provide a resistance change memory device with a high ON/OFF ratio.

Means for Solving Problem

A resistance change memory device according to an embodiment, includes a first electrode containing a first element, a resistance change layer provided on the first electrode and containing an oxide of the first element, an oxygen conductive layer provided on the resistance change layer, containing a second element and oxygen, having oxygen ion conductivity, and having a relative permittivity higher than a relative permittivity of the resistance change layer, and a second electrode provided on the oxygen conductive layer. The resistance change layer undergoes dielectric breakdown earlier than the oxygen conductive layer when a voltage between the first electrode and the second electrode is continuously increased from zero.

BRIEF DESCRIPTION OF DRAWING

FIG. 2A shows a low resistance state, and FIG. 2B shows a high resistance state.

FIGS. 3A and 3B are diagrams schematically describing the effects of the embodiment, with the state on the horizontal axis and the magnitude of the current flowing when a constant read voltage is applied on the vertical axis. FIG. 3A shows a conventional device, and FIG. 3B shows the device of the embodiment.

FIGS. 14A to 14C are diagrams schematically showing operations of a conventional resistance change memory device. FIG. 14A shows an initial state, FIG. 14B shows a low resistance state, and FIG. 14C shows a high resistance state.

MODE FOR CARRYING OUT THE INVENTION

Hereinbelow, an embodiment of the invention is described with reference to the drawings.

Figure 1:
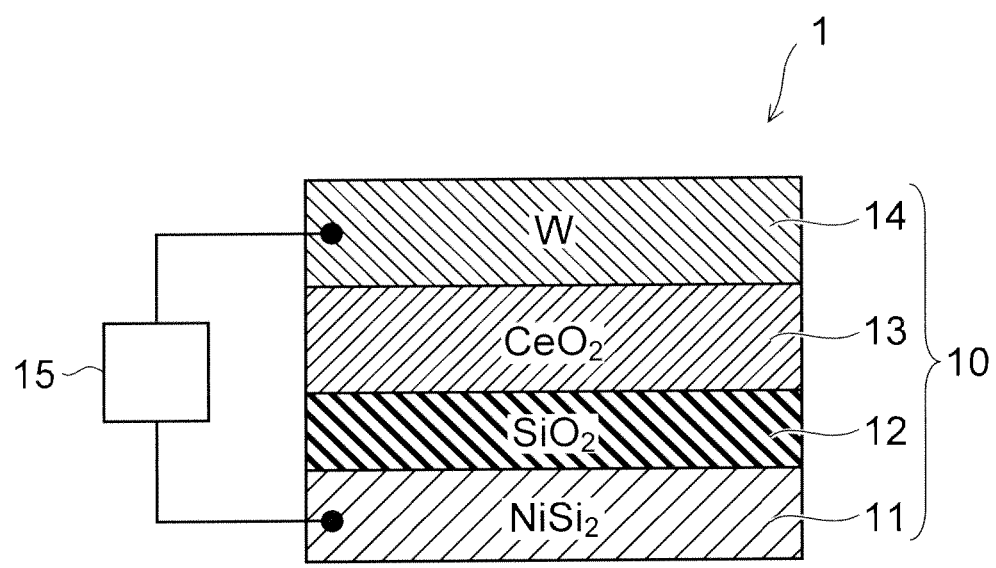
FIG. 1 is a cross-sectional view illustrating a resistance change device according to an embodiment.

FIG. 1 is a cross-sectional view illustrating a resistance change device according to the embodiment.

As shown in FIG. 1, a memory cell 10 is provided in a resistance change memory device according to the embodiment (hereinafter it may be referred to simply as a "device 1"). In the memory cell 10, a lower electrode 11, a resistance change layer 12, an oxygen conductive layer 13, and an upper electrode 14 are stacked in this order. The resistance change layer 12 is in contact with the lower electrode 11 and the oxygen conductive layer 13, and the oxygen conductive layer 13 is in contact with the upper electrode 14, for example. In the device 1, a power supply circuit 15 that applies a voltage between the lower electrode 11 and the upper electrode 14 is provided. In the specification, for convenience of description, the direction from the lower electrode 11 toward the upper electrode 14 is referred to as "upward", and the opposite direction is referred to as "downward"; but these are irrelevant to the direction of gravity.

First, the configuration of the memory cell 10 is described using an example of the material of each component. FIG. 1 shows the chemical formulae of the materials illustrated below. However, the materials of the components are not limited to the following examples. General characteristics of the material required for each component are described later.

The lower electrode 11 is formed of a material containing silicon (Si), such as nickel disilicide ($NiSi_2$).

The resistance change layer 12 is formed of a covalently bonded oxide, such as a silicon oxide, for example silicon dioxide ($SiO_2$).

The oxygen conductive layer 13 is a layer having oxygen ion conductivity, and is formed of an ionically bonded oxide, such as a cerium oxide ($CeO_x$), for example cerium dioxide ($CeO_2$).

The upper electrode 14 is formed of an electrically conductive material such as tungsten (W).

The memory cell 10 like this can be formed on a substrate (not shown) by sequentially depositing nickel disilicide, a silicon oxide, a cerium oxide, and tungsten by the EB (electron beam) vapor deposition method, the sputtering method, CVD (chemical vapor deposition), ALD (atomic layer deposition), or the like, for example. Alternatively, nickel disilicide, a cerium oxide, and tungsten may be sequentially deposited on a substrate, and then heat treatment may be performed to form a silicon oxide layer at the interface between the lower electrode 11 made of nickel disilicide and the oxygen conductive layer 13 made of a cerium oxide.

Next, operations of the resistance change memory device according to the embodiment are described.

Figure 2A:
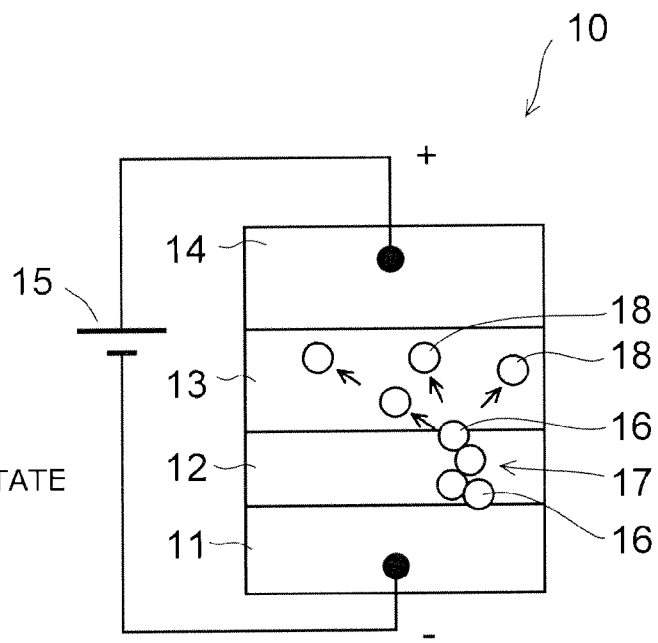
FIGS. 2A and 2B are schematic cross-sectional views illustrating operations of the resistance change memory device according to the embodiment.
Figure 2B:
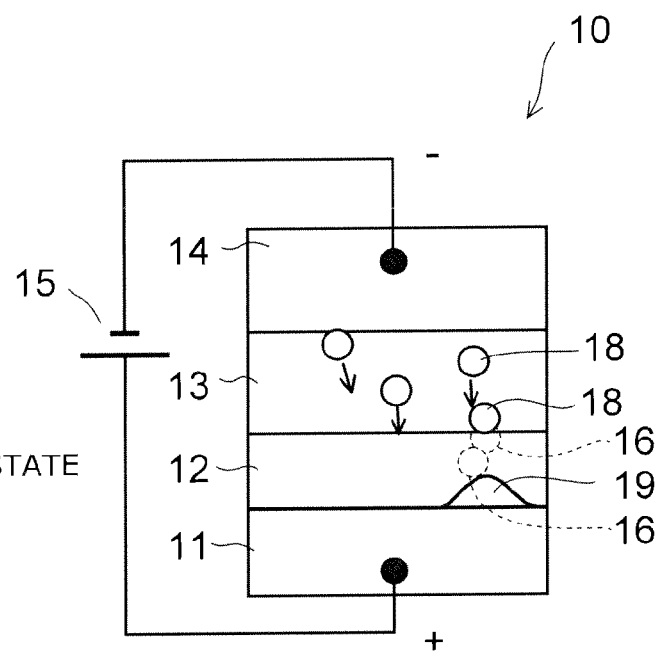

FIGS. 2A and 2B are schematic cross-sectional views illustrating operations of the resistance change memory device according to the embodiment. FIG. 2A shows a low resistance state, and FIG. 2B shows a high resistance state.

As shown in FIG. 1, in the initial state, the resistance change layer 12 is formed of a silicon oxide with a uniform composition, and includes few oxygen-deficient portions. Therefore, the resistance change layer 12 has high insulating properties in the initial state.

First, the operation of "forming" is described.

As shown in FIG. 2A, a voltage at which the lower electrode 11 becomes a negative pole and the upper electrode 14 becomes a positive pole (hereinafter referred to as a "positive voltage") is applied between the lower electrode 11 and the upper electrode 14 by the power supply circuit 15, and the voltage is continuously increased from zero. Since the relative permittivity of the oxygen conductive layer 13 made of cerium dioxide ($CeO_2$) is approximately 28 and the relative permittivity of the resistance change layer 12 made of silicon dioxide ($SiO_2$) is approximately 4, the relative permittivity of the oxygen conductive layer 13 is higher than the relative permittivity of the resistance change layer 12. On the other hand, since the product of relative permittivity and electric field strength is constant, the strength of the electric field generated in the resistance change layer 12 is higher than the strength of the electric field generated in the oxygen conductive layer 13. Therefore, when the voltage is increased, the resistance change layer 12 undergoes dielectric breakdown earlier than the oxygen conductive layer 13.

Thereby, a current path 17 in which oxygen-deficient portions 16 stretch in a line in the thickness direction is formed in the resistance change layer 12. The oxygen-deficient portion 16 is a portion where the oxygen concentration is lower and the silicon concentration is higher than in the surroundings. As a result, the resistance change layer 12 becomes a "low resistance state," and the electric resistance value decreases discontinuously. At this time, the oxygen that has been contained in the oxygen-deficient portion 15 is ionized into an oxygen ion 17 ($O^{2-}$), and receives the action of the electric field to be discharged into the oxygen conductive layer 13 on the positive pole side. The oxygen conductive layer 13 is formed of an ionically bonded oxide, and therefore contains a large number of oxygen ions from the beginning. In the "low resistance state," the electric resistance value of the memory cell 10 is almost determined by the electric resistance value of the oxygen conductive layer 13. The resistance change layer 12 becoming the "low resistance state" and the electric resistance value of the memory cell 10 becoming almost the electric resistance value of the oxygen conductive layer 13 in this way is referred to as "the resistance change layer undergoes dielectric breakdown earlier than the oxygen conductive layer" in the specification.

Next, the operation of "reset" is described.

As shown in FIG. 2B, when a voltage at which the lower electrode 11 becomes a positive pole and the upper electrode 14 becomes a negative pole (hereinafter referred to as a "negative voltage") is applied between the lower electrode 11 and the upper electrode 14 by the power supply circuit 15, a force toward the resistance change layer 12, which is the positive pole side, acts on the oxygen ion 18. Thereby, oxygen ions 18 contained in the oxygen conductive layer 13 move toward the resistance change layer 12 one after another.

Part of the oxygen ions 18 that have entered the resistance change layer 12 reach oxygen-deficient portions 16 and eliminate the oxygen-deficient portions 16. Another part of the oxygen ions 18 pass through the resistance change layer 12 and reach the lower electrode 11, and oxidize silicon contained in the lower electrode 11, for example, make local anodic oxidation of silicon. Thereby, a silicon oxide 19 grows toward the interior of the resistance change layer 12, with the upper surface of the lower electrode 11 as a starting point. By these actions, oxygen-deficient portions 16 are re-oxidized to repair the dielectric breakdown, and the most part or whole of the current path 17 is eliminated; thus, the resistance change layer 12 becomes a "high resistance state." At this time, if the whole of the current path 17 is eliminated, the electric resistance value of the resistance change layer 12 returns to the value before the forming. In the "high resistance state," the electric resistance value of the memory cell 10 is almost determined by the electric resistance value of the resistance change layer 12.

Next, the operation of "set" is described.

As shown in FIG. 2A, when a positive voltage is applied between the lower electrode 11 and the upper electrode 14 by the power supply circuit 15, the resistance change layer 12 undergoes dielectric breakdown again, and a current path 17 formed of oxygen-deficient portions 16 is re-formed. Thereby, the resistance change layer 12 returns to the "low resistance state." At this time, if the whole of the current path 17 had been eliminated by the "reset" described above, the phenomenon that occurs at the time of the "set" would be almost the same as the phenomenon that occurs at the time of the "forming" described above, and the set voltage necessary for setting would be almost equal to the forming voltage necessary for forming.

Thus, in the memory cell 10, the resistance change layer 12 repeats dielectric breakdown and repair to have two states, the low resistance state and the high resistance state, and stores information. At the time of resetting, the oxygen conductive layer 13 supplies oxygen ions to the resistance change layer 12, and the lower electrode 11 supplies silicon to the resistance change layer 12; thereby, the dielectric breakdown of the resistance change layer 12 is repaired.

Next, effects of the embodiment are described.

First, an effect in which the memory cell 10 configured in the above manner functions as a resistance change memory element is described.

In the device 1 according to the embodiment, the relative permittivity of the oxygen conductive layer 13 is higher than the relative permittivity of the resistance change layer 12. Therefore, when a voltage is applied between the lower electrode 11 and the upper electrode 14, the strength of the electric field applied to the resistance change layer 12 is higher than the strength of the electric field applied to the oxygen conductive layer 13. Thereby, even in the case where a layer that has a high dielectric breakdown voltage like a silicon oxide layer and has high insulating properties is selected as the resistance change layer 12, when the voltage is continuously increased from zero between the lower electrode 11 and the upper electrode 14, the resistance change layer 12 undergoes dielectric breakdown earlier than the oxygen conductive layer 13. Consequently, "forming" and "set" are enabled.

On the other hand, in the resistance change memory device 1 according to the embodiment, the resistance change layer 12 is made of a silicon oxide, the lower electrode 11 contains silicon, and the oxygen conductive layer 13 has the capability to conduct oxygen ions. Therefore, when a negative voltage at which the lower electrode 11 becomes a positive pole and the upper electrode 14 becomes a negative pole is applied, the oxygen conductive layer 13 can supply oxygen to the resistance change layer 12, and silicon contained in the lower electrode 11 can combine with oxygen supplied via the oxygen conductive layer 13 and the resistance change layer 12 to form a silicon oxide. Thereby, oxygen-deficient portions 16 can be eliminated and a silicon oxide 19 can be produced in the resistance change layer 12; and the dielectric breakdown in the resistance change layer 12 can be repaired. Consequently, the resistance change layer 12 can be transitioned from the "low resistance state" to the "high resistance state." That is, "reset" is enabled.

Thus, the memory cell 10 can be used as a resistance change memory element.

Next, an effect in which the ON/OFF ratio is increased is described.

As described above, in the embodiment, since the relative permittivity of the oxygen conductive layer 13 is higher than the relative permittivity of the resistance change layer 12, the "set" operation can be performed surely even when an insulating layer with good insulating properties is used as the resistance change layer 12. By using a layer with high insulating properties as the resistance change layer 12, the electric resistance value in the initial state of the resistance change layer 12 can be increased.

In the embodiment, by sandwiching the resistance change layer 12 by the lower electrode 11 containing silicon and the oxygen conductive layer 13 having oxygen ion conductivity, the current path 17 formed in the resistance change layer 12 can be effectively eliminated at the time of resetting. Thereby, the whole or most part of the current path 17 can be eliminated, and the electric resistance value of the resistance change layer 12 can be returned to the value of the initial state or a value close to this.

As a result, the electric resistance value when the resistance change layer 12 is in the high resistance state can be increased, and the ON/OFF ratio can be increased.

This effect can be expressed from another point of view as follows. That is, in the conventional resistance change memory device, the resistance change layer is formed of a special metal oxide containing a large amount of oxygen-deficient portions, and forming is performed on the resistance change layer to form a filament; and the conduction state between an end portion of the filament and the electrode is controlled to switch between the low resistance state and the high resistance state. Therefore, in the time of the high resistance state, the electric resistance is determined by the small gap between the end portion of the filament and the electrode; accordingly, the ON/OFF ratio is low.

In contrast, in the embodiment, the dielectric breakdown of the silicon oxide layer can be repaired almost completely by providing the lower electrode 11 containing silicon and the oxygen conductive layer 13 having oxygen ion conductivity. Therefore, dielectric breakdown and repair are repeated for the whole resistance change layer 12 to switch between the low resistance state and the high resistance state. Accordingly, the ON/OFF ratio is high.

In the embodiment, by providing the lower electrode 11 and the oxygen conductive layer 13, a silicon oxide layer, which conventionally has not been used as a resistance change layer in spite of having good insulating properties, can be used as the resistance change layer 12. Thus, the resistance change memory device according to the embodiment is completely different from the conventional resistance change memory device in the operating principle, and can thus achieve good characteristics.

FIGS. 3A and 3B are diagrams schematically describing the effects described above, with the state on the horizontal axis and the magnitude of the current flowing when a constant read voltage is applied on the vertical axis. FIG. 3A shows a conventional device, and FIG. 3B shows the device of the embodiment.

The gray rectangle shown in FIGS. 3A and 3B is a bar graph showing the magnitude of the flowing current. The circle indicates the oxygen-deficient portion formed in the resistance change layer, and the position along the vertical direction of the drawings corresponds to the position in the thickness direction in the resistance change layer. These show that, the longer the current path remaining in the resistance change layer in the high resistance state is, the larger the flowing current is and the lower the ON/OFF ratio is. The descriptions of FIGS. 3A and 3B are not strict ones, nor are quantitative ones.

As shown in FIG. 3A, in the conventional resistance change memory device shown in FIGS. 14A to 14C and FIG. 15, although a filament 116 (a current path) is formed by forming during the manufacturing of the device, in subsequent resetting and setting only one end portion of the filament 116 is broken off and repaired. Therefore, the amount of change in the electric resistance value at the times of resetting and setting is significantly smaller than the amount of change in the electric resistance value at the time of forming. Accordingly, the ON/OFF ratio is small.

In contrast, as shown in FIG. 3B, in the resistance change memory device 1 according to the embodiment shown in FIGS. 1A to 1C and FIG. 2, due to the presence of the lower electrode 11 and the oxygen conductive layer 13, the dielectric breakdown is almost completely repaired at the time of resetting, and the whole or most part of the current path 17 is eliminated. That is, in resetting and setting, the whole or most part of the current path 17 repeats disappearance and reformation. Therefore, the amount of change in the electric resistance value at the times of resetting and setting is almost equal to the amount of change in the electric resistance value at the time of forming, and the ON/OFF ratio is large.

Next, an effect in which forming can be omitted is described.

As described above, if it is possible to eliminate the whole of the current path 17 at the time of resetting, the high resistance state is similar to the initial state, and the forming voltage is equal to the set voltage. Therefore, it is not necessary to perform forming particularly. As a result, a "forming-free" resistance change memory device that does not need forming can be provided. As described later, to eliminate the whole of the current path 17, a thinner resistance change layer 12 is more advantageous, and a higher oxygen ion conductivity of the oxygen conductive layer 13 is more advantageous.

Next, an effect in which the operating speed of the device is improved is described.

In the device 1 of the embodiment, the oxygen conductive layer 13 is provided on the resistance change layer 12; and at the time of resetting, the dielectric breakdown of the resistance change layer 12 can be quickly repaired by applying a voltage to supply oxygen ions from the oxygen conductive layer 13 to the resistance change layer 12. Therefore, the speed of resetting is high. At the time of setting, oxygen in the resistance change layer 12 can be quickly discharged to the oxygen conductive layer 13. Therefore, also the speed of setting is high.

In the above description, an example of the material forming each component of the memory cell 10 is used to describe operations and effects thereof. General characteristics of the material required for each component of the memory cell 10 will now be described. Even when the material of each component is changed within the range illustrated below, the operations and effects of the device 1 are similar to those described above.

First, the material of the resistance change layer 12 is described.

The resistance change layer 12 is something that is insulating in the high resistance state and of which the dielectric breakdown is repaired by being supplied with oxygen at the time of resetting; therefore, it is preferably some kind of oxide. It is preferably a material with good insulating properties and a high dielectric breakdown voltage in order to achieve a sufficiently high electric resistance value in the time of the high resistance state and to prevent dielectric breakdown due to noise etc. Specifically, the material that forms the resistance change layer 12 preferably has a dielectric breakdown electric field of 10 MV/cm or more. As such a material, a covalently bonded oxide is preferable, and the absolute value of the difference between the electronegativity of the element that is oxidized and the electronegativity of oxygen is preferably 1.7 or less, for example.

The relative permittivity of the material of the resistance change layer 12 is preferably low in order to generate a strong electric field in the resistance change layer 12 to cause dielectric breakdown surely when a voltage is applied between the lower electrode 11 and the upper electrode 14. Specifically, the relative permittivity is preferably 10 or less. Specific examples of the material satisfying the conditions described above include a silicon oxide, a germanium oxide, and an aluminum oxide, and silicon dioxide ($SiO_2$) is particularly preferable. The thickness of the resistance change layer 12 is preferably 1 to 5 nm, for example.

Next, the material of the oxygen conductive layer 13 is described.

The material of the oxygen conductive layer 13 is a material that itself contains oxygen ions and has a high oxygen ion conductivity. The higher the oxygen ion conductivity is, the more quickly the dielectric breakdown of a thicker resistance change layer 12 can be repaired. Specifically, the oxygen ion conductivity is preferably $10^{-10}$ S/cm or more. The material of the oxygen conductive layer 13 is preferably a material with a small band gap in order to reduce the electric resistance value of the whole memory cell in the time of the low resistance state. Specifically, a material with a band gap of 6 eV or less is preferable. The electric field generated in the oxygen conductive layer 13 is preferably weak in order to generate a strong electric field in the resistance change layer 12 when a voltage is applied between the lower electrode 11 and the upper electrode 14. Thus, the relative permittivity of the material of the oxygen conductive layer 13 is preferably high; specifically, the relative permittivity is preferably 10 or more. The thickness of the oxygen conductive layer 13 is preferably 1 to 20 nm, for example.

As such a material, an ionically bonded oxide is preferable, and an oxide in which the absolute value of the difference between the electronegativity of the element that is oxidized and the electronegativity of oxygen is 1.7 or more is preferable, for example. The material of the oxygen conductive layer 13 is preferably a material having the fluorite-type crystal structure. As specific examples of the material satisfying the conditions described above, for materials having the fluorite-type crystal structure, one or more oxides selected from the group consisting of a cerium oxide ($CeO_x$) and yttria stabilized zirconia (YSZ; $(Y_2O_3)_{1-x}(ZrO_2)_x$) are given. As materials having other crystal structures, one or more oxides selected from the group consisting of a hafnium oxide ($HfO_x$), a zirconium oxide ($ZrO_x$), a titanium oxide ($TiO_x$), and strontium titanate (STO) are given. Cerium dioxide ($CeO_2$) and hafnium dioxide ($HfO_2$) are particularly preferable. Cerium dioxide frequently switches between the trivalent state and the tetravalent state, and provides a high oxygen ion conductivity.

Figure 4:
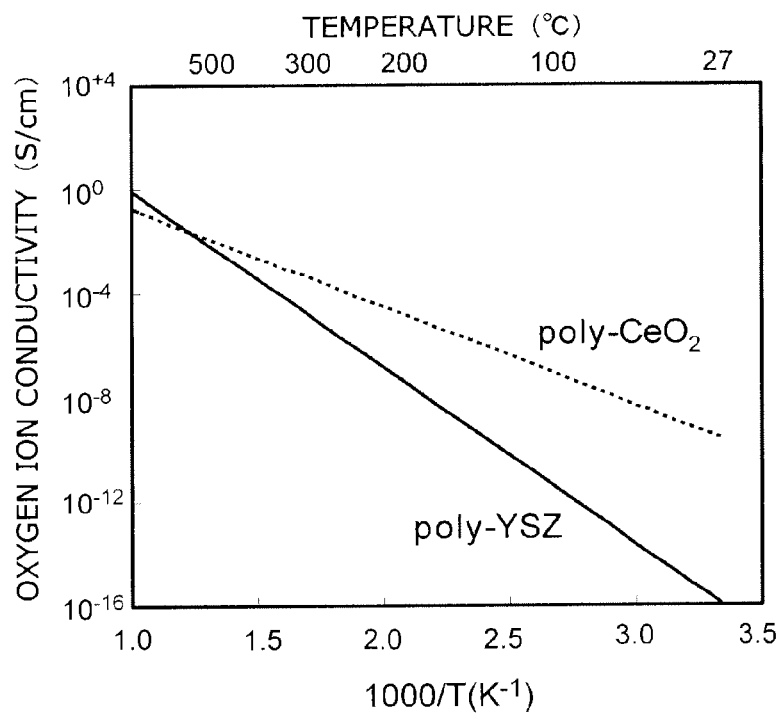
FIG. 4 is a graph illustrating the oxygen ion conductivities of polycrystalline cerium dioxide (poly-$CeO_2$) and polycrystalline yttria stabilized zirconia (poly-YSZ), with temperature on the horizontal axis and the oxygen ion conductivity on the vertical axis.

FIG. 4 is a graph illustrating the oxygen ion conductivities of polycrystalline cerium dioxide (poly-$CeO_2$) and polycrystalline yttria stabilized zirconia (poly-YSZ), with temperature on the horizontal axis and the oxygen ion conductivity on the vertical axis.

As shown in FIG. 4, the oxygen ion conductivity of polycrystalline YSZ is higher than the oxygen ion conductivity of polycrystalline cerium dioxide in the temperature range of approximately 500° C. or more, whereas the oxygen ion conductivity of polycrystalline cerium dioxide is higher in the temperature range of approximately 500° C. or less. In particular, near room temperature (27° C.), there is a difference of approximately $10^4$ to $10^8$ times. Since the memory device is operated near room temperature, cerium dioxide is preferable to YSZ as the material of the oxygen conductive layer 13 in terms of oxygen ion conductivity.

A small amount of a lanthanoid such as lanthanum (La) and gadolinium (Gd) may be added to cerium dioxide ($CeO_2$). Thereby, these additive elements segregate at crystal grain boundaries of cerium dioxide, and the oxygen ion conductivity is improved.

Next, the relationship between the material of the resistance change layer 12 and the material of the oxygen conductive layer 13 is described.

To enable forming and setting, it is necessary that, when the voltage between the lower electrode 11 and the upper electrode 14 is continuously increased from zero, the resistance change layer 12 undergo dielectric breakdown earlier than the oxygen conductive layer 13. To this end, it is preferable that the electric field generated in the resistance change layer 12 be stronger than the electric field generated in the oxygen conductive layer 13; thus, it is preferable that the relative permittivity of the resistance change layer 12 be lower than the relative permittivity of the oxygen conductive layer 13. As described above, since the resistance change layer 12 preferably has high insulating properties and a low relative permittivity, the resistance change layer 12 is preferably made of a covalently bonded oxide. On the other hand, since the oxygen conductive layer 13 preferably has a higher electric conductivity and a higher relative permittivity than the resistance change layer 12, the oxygen conductive layer 13 is preferably made of an ionically bonded oxide. Hence, it is preferable that the absolute value of the difference between the electronegativity of the element that is oxidized (for example, silicon) contained in the resistance change layer 12 and the electronegativity of oxygen be smaller than the absolute value of the difference between the electronegativity of the element that is oxidized (for example, cerium) contained in the oxygen conductive layer 13 and the electronegativity of oxygen.

The thickness of the resistance change layer 12 is preferably a thickness at which oxygen ions can be supplied to the interface between the lower electrode 11 and the resistance change layer 12 by the oxygen conductive layer 13. Thereby, the dielectric breakdown can be repaired by the production of a silicon oxide not only from the oxygen conductive layer 13 side but also from the lower electrode 11 side, and the dielectric breakdown can be repaired over the entire thickness direction of the resistance change layer 12. As a result, the electric resistance value of the high resistance state can be returned to a value equivalent to the initial state, and the ON/OF ratio can be made higher. In other words, the effect of setting becomes equivalent to the effect of forming, and forming becomes unnecessary. The thickness of the resistance change layer 12 at which oxygen ions can diffuse is proportional to the square root of the oxygen ion conductivity of the oxygen conductive layer 13. That is, when the oxygen ion conductivity of the oxygen conductive layer 13 is denoted by a and the thickness of the resistance change layer 12 at which oxygen ions can seep in thermal equilibrium is denoted by t, Mathematical Formula 1 below holds.

$$t \propto \sqrt{\sigma} \qquad \text{[Mathematical Formula 1]}$$

When the parameter in accordance with each material is substituted in Mathematical Formula 1 above to create an equality, if the left side including t is smaller than the right side including a, oxygen ions are supplied over the entire thickness direction of the resistance change layer 12 and forming is unnecessary.

Figure 5:
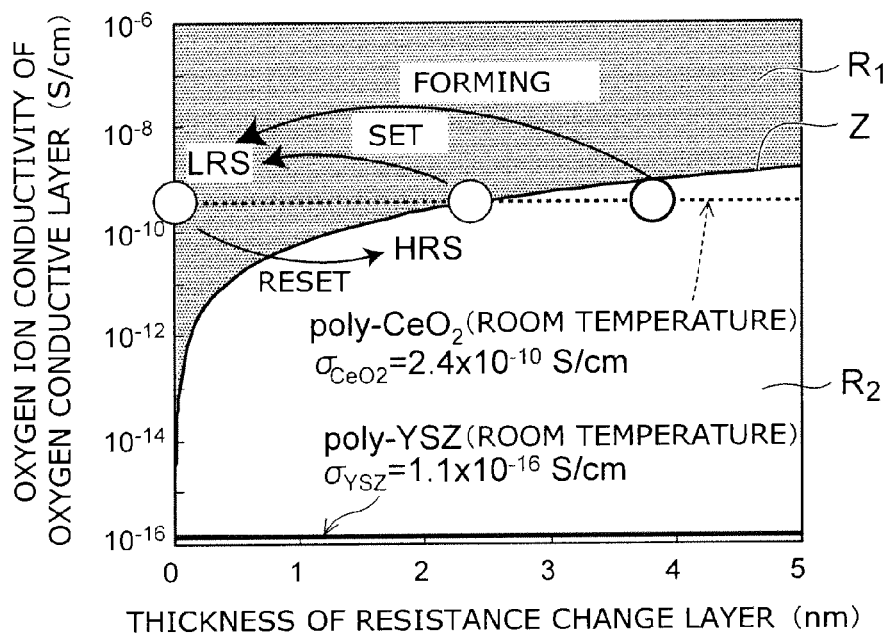
FIG. 5 is a graph showing the relationship between the thickness of the resistance change layer at which forming is unnecessary and the oxygen ion conductivity of the oxygen conductive layer, with the thickness of the resistance change layer on the horizontal axis and the oxygen ion conductivity of the oxygen conductive layer on the vertical axis.

FIG. 5 is a graph showing the relationship between the thickness of the resistance change layer at which forming is unnecessary and the oxygen ion conductivity of the oxygen conductive layer, with the thickness of the resistance change layer on the horizontal axis and the oxygen ion conductivity of the oxygen conductive layer on the vertical axis.

A curved line Z shown in FIG. 5 corresponds to Mathematical Formula 1 mentioned above. FIG. 5 shows the case where the oxygen conductive layer 13 is formed of polycrystalline cerium dioxide and the case where it is formed of polycrystalline YSZ.

As shown in FIG. 5, when the plotted points expressing the relationship between the thickness of the resistance change layer 12 and the oxygen ion conductivity of the oxygen conductive layer 13 are in region $R_1$, at the time of resetting, oxygen ions supplied by the oxygen conductive layer 13 reach the interface between the resistance change layer 12 and the lower electrode 11, and therefore the electric resistance value of the resistance change layer 12 in the high resistance state returns to the value of the initial state. In this case, forming is unnecessary.

On the other hand, when the plotted points are in region $R_2$, at the time of resetting, oxygen ions do not reach the interface between the resistance change layer 12 and the lower electrode 11, and therefore the electric resistance value of the resistance change layer 12 in the high resistance state does not return to the value of the initial state and is lower than this. Conversely, to transition the resistance change layer 12 from the initial state to the low resistance state, the set operation alone is not enough and a dedicated forming operation is needed.

As shown in FIG. 5, to omit the forming operation, it is necessary that the thickness of the resistance change layer 12 be not more than a prescribed thickness determined by the oxygen ion conductivity of the oxygen conductive layer 13. That is, the higher the oxygen ion conductivity of the oxygen conductive layer 13 is, the thicker the resistance change layer 12 can be made while forming-free is achieved. The thicker the resistance change layer 12 is, the higher the ON/OFF ratio can be made. Therefore, to increase the ON/OFF ratio while achieving forming-free, it is preferable that the oxygen conductive layer 13 be formed of a material with a high oxygen ion conductivity and the thickness of the resistance change layer 12 be controlled with good accuracy.

Next, the material of the lower electrode 11 is described.

The lower electrode 11 needs to have electrical conductivity necessary as an electrode and contain the same element as the element that is oxidized out of the elements contained in the resistance change layer 12. For the lower electrode 11, it is preferable that the same kind of material as the material of the resistance change layer 12 be formed by local anodic oxidation.

When the resistance change layer 12 is made of a silicon oxide, silicon doped with an impurity and having the conductivity type of the p-type or the n-type or a metal silicide is given as the material of the lower electrode 11, for example. As the metal silicide, a nickel silicide is given, for example. There are some kinds of nickel silicides; among them, nickel disilicide ($NiSi_2$), which has the highest percentage of silicon content, is particularly preferable.

Next, the material of the upper electrode 14 is described.

The upper electrode 14 is formed of an electrically conductive material in order to have electrical conductivity necessary as an electrode. It is preferably formed of a material that does not react with the oxygen conductive layer 13. This is because, if the upper electrode 14 reacts with the oxygen conductive layer 13, an intermetallic compound layer will be formed at the interface; and the electric resistance value will be increased and the control of the composition and thickness of the oxygen conductive layer 13 will be difficult. To prevent the upper electrode 14 from reacting with the oxygen conductive layer 13, the Gibbs free energy is preferably higher than that of the metal contained in the oxygen conductive layer, for example higher than −700 kJ. Specific examples of the material of the upper electrode 14 satisfying such conditions include tungsten (W) and platinum (Pt). In the case where the main body portion of the upper electrode 14 is formed of a tungsten layer, a barrier layer made of a titanium nitride (TiN) or the like may be formed on the tungsten layer in order to suppress the entry of oxygen into the tungsten layer.

Next, the set voltage necessary for the operation of the resistance change memory device 1 according to the embodiment is described.

The voltage $V_{app}$ applied between the lower electrode 11 and the upper electrode 14 is divided between the resistance change layer 12 and the oxygen conductive layer 13 in accordance with the product of the electric field and the thickness of each layer. That is, when the thickness of the resistance change layer 12 is denoted by $t_{VR}$, the electric field strength thereof is denoted by $E_{VR}$, the thickness of the oxygen conductive layer 13 is denoted by $t_{OC}$, and the electric field strength thereof is denoted by $E_{OC}$, Mathematical Formula 2 below holds.

$$V_{app} = E_{VR} \times t_{VR} + E_{OC} \times t_{OC} \qquad \text{[Mathematical Formula 2]}$$

When the electric field strength necessary for the dielectric breakdown of the resistance change layer 12 is denoted by $E_{VR}^{BD}$, the set voltage necessary for it is denoted by $V_{set}$, the relative permittivity of the resistance change layer 12 is denoted by $k_{VR}$, and the relative permittivity of the oxygen conductive layer 13 is denoted by $k_{OC}$, the set voltage $V_{set}$ is given by Mathematical Formula 3 below, in view of the product of electric field strength and relative permittivity being constant. The forming voltage is similar to the above. The power supply circuit 15 shown in FIG. 1 needs to have the capability to output a voltage $V_{app}$ not less than the set voltage $V_{set}$ expressed by Mathematical Formula 3 below.

$$V_{app} \geq V_{set} = E_{VR}^{BD}\left(t_{VR} + \frac{E_{OC}}{E_{VR}} \times t_{OC}\right) = E_{VR}^{BD}\left(t_{VR} + \frac{k_{VR}}{k_{OC}} \times t_{OC}\right)$$ [Mathematical Formula 3]

In the case where the resistance change layer 12 is formed of silicon dioxide ($SiO_2$) and the oxygen conductive layer 13 is formed of cerium dioxide ($CeO_2$), when the insulation electric field strength of $SiO_2$ is denoted by $E_{SiO2}^{BD}$, Mathematical Formula 3 above can be expressed as Mathematical Formula 4 below, in view of the relative permittivity $k_{SiO2}$ of $SiO_2$ being approximately 4 and the relative permittivity $k_{CeO2}$ of $CeO_2$ being approximately 28, for example.

$$V_{set} = E_{SiO2}^{BD}\left(t_{SiO2} + \frac{1}{7} \times t_{CeO2}\right)$$ [Mathematical Formula 4]

Based on Mathematical Formula 4 above, the set voltage $V_{set}$ that the thickness $t_{OC}$ of the oxygen conductive layer 13 and the thickness $t_{SiO2}$ of the resistance change layer 12 need has been calculated for the case where the material of the oxygen conductive layer 13 is $CeO_2$ (k=28) or $HfO_2$ (k=16). At this time, the insulation electric field strength $E_{SiO2}^{BD}$ of $SiO_2$ was set to 14 MV/cm. The calculation results are shown in FIG. 6.

Figure 6:
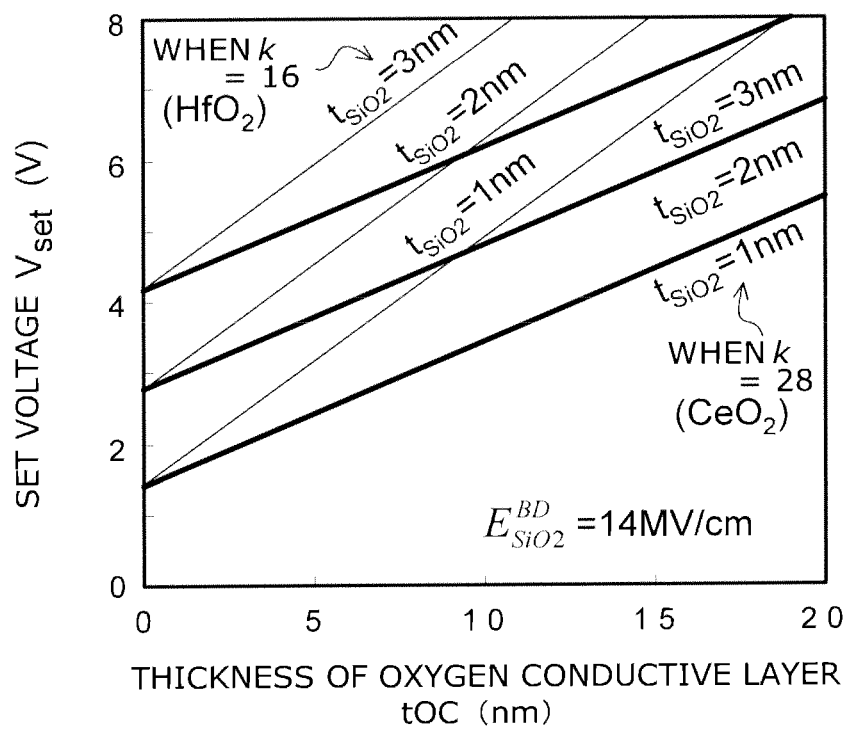
FIG. 6 is a graph illustrating the influence of various factors on the necessary set voltage, with the thickness of the oxygen conductive layer on the horizontal axis and the set voltage on the vertical axis.

FIG. 6 is a graph illustrating the influence of various factors on the necessary set voltage, with the thickness of the oxygen conductive layer on the horizontal axis and the set voltage on the vertical axis.

As shown in FIG. 6, the smaller the thickness $t_{SiO2}$ of the resistance change layer 12 is, the lower the set voltage $V_{set}$ is. The smaller the thickness $t_{OC}$ of the oxygen conductive layer 13 is, the lower the set voltage $V_{set}$ is. The case where $CeO_2$ with a higher relative permittivity is used as the material of the oxygen conductive layer 13 is more advantageous for reduction in the set voltage $V_{set}$ than the case of using $HfO_2$ with a lower relative permittivity. However, the resistance change layer 12 is preferably thick enough to provide a prescribed electric resistance value surely in the time of the high resistance state. Furthermore, the oxygen conductive layer 13 is preferably thick enough to supply sufficient oxygen ions to the resistance change layer 12.

A resistance change memory device in which $SiO_2$ is used as the material of the resistance change layer 12 and $CeO_2$ is used as the material of the oxygen conductive layer 13 can achieve a high ON/OFF ratio (the value of the ratio of the resistance value of the high resistance state to the resistance value of the low resistance state) more than $1\times10^4$ when the read voltage is set to −0.1 V. Values of $1\times10^5$ to $1\times10^8$ can be achieved as the ON/OFF ratio, for example. The high ON/OFF ratio is kept as it is even if a heat treatment with a temperature range of not less than normal temperature and not more than 700° C., for example a heat treatment with a temperature of 400 to 700° C., is performed on the memory cell 10. Therefore, in the manufacturing process of the resistance change memory device, a process performed in a high temperature atmosphere of 700° C. or less, for example 400 to 700° C., can be performed. That is, the resistance change memory device in which $SiO_2$ is used as the material of the resistance change layer 12 and $CeO_2$ is used as the material of the oxygen conductive layer 13 can not only provide a good ON/OFF ratio, but also employ a high temperature heat treatment as a manufacturing process, and further have a high flexibility of manufacturing processes.

Next, examples and comparative examples are described.

In the examples and the comparative examples described below, samples were actually fabricated by the EB vapor deposition method, and the I-V characteristics thereof were measured. The planar size of each sample was set to a square with one side of 20 µm. In a first example and a first comparative example, a cross section of the sample was observed by TEM (transmission electron microscopy) and a photograph was taken.

First Example and First Comparative Example

Figure 7A:
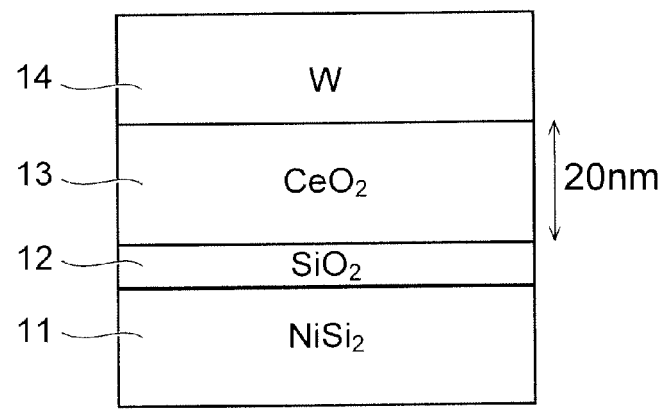
FIG. 7A is a cross-sectional view showing the sample of a first example.
Figure 7B:
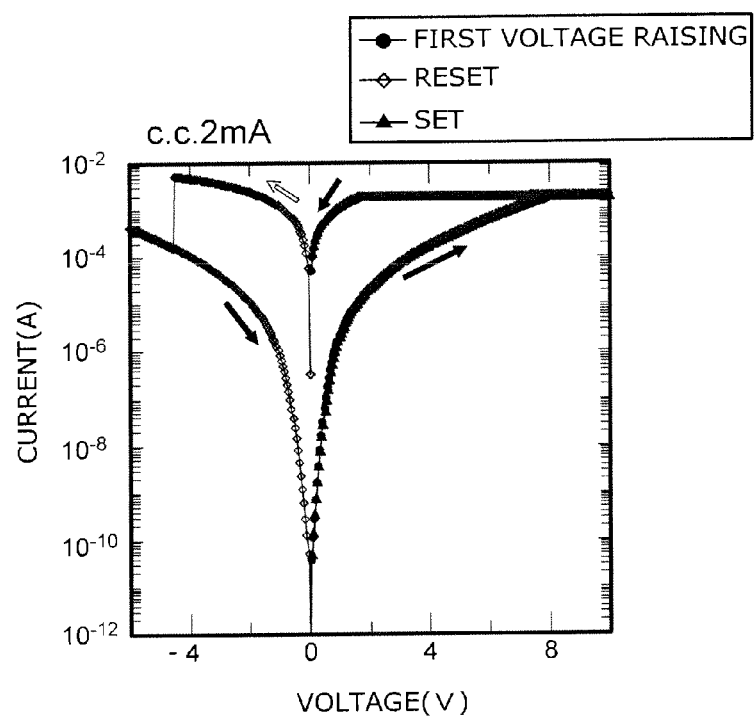
FIG. 7B is a graph showing the I-V characteristics of the sample, with the voltage on the horizontal axis and the current on the vertical axis.

FIG. 7A is a cross-sectional view showing the sample of a first example, and FIG. 7B is a graph showing the I-V characteristics of the sample, with the voltage on the horizontal axis and the current on the vertical axis.

Figure 8A:
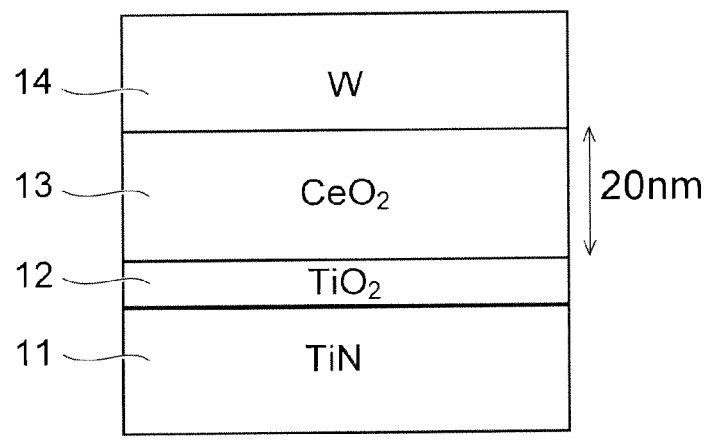
FIG. 8A is a cross-sectional view showing the sample of a first comparative example.
Figure 8B:
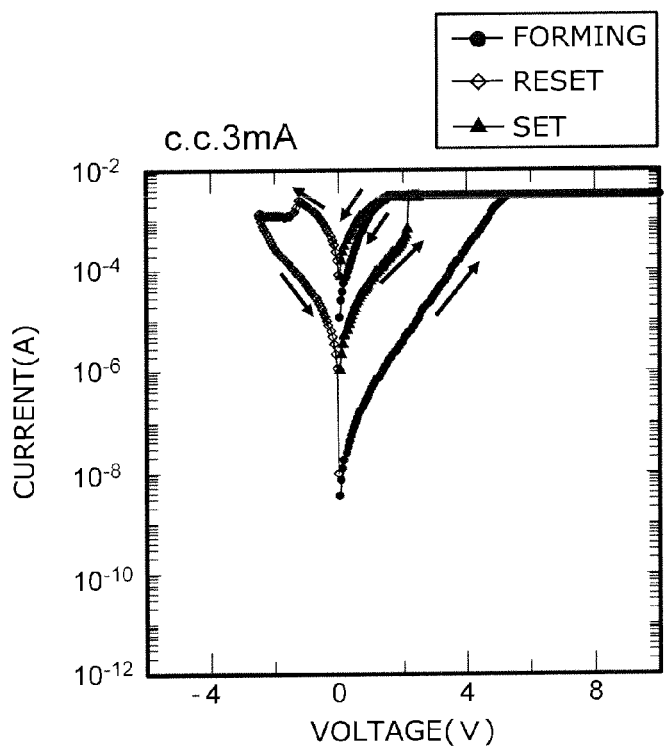
FIG. 8B is a graph showing the I-V characteristics of the sample, with the voltage on the horizontal axis and the current on the vertical axis.

FIG. 8A is a cross-sectional view showing the sample of a first comparative example, and FIG. 8B is a graph showing the I-V characteristics of the sample, with the voltage on the horizontal axis and the current on the vertical axis.

Figure 9A:
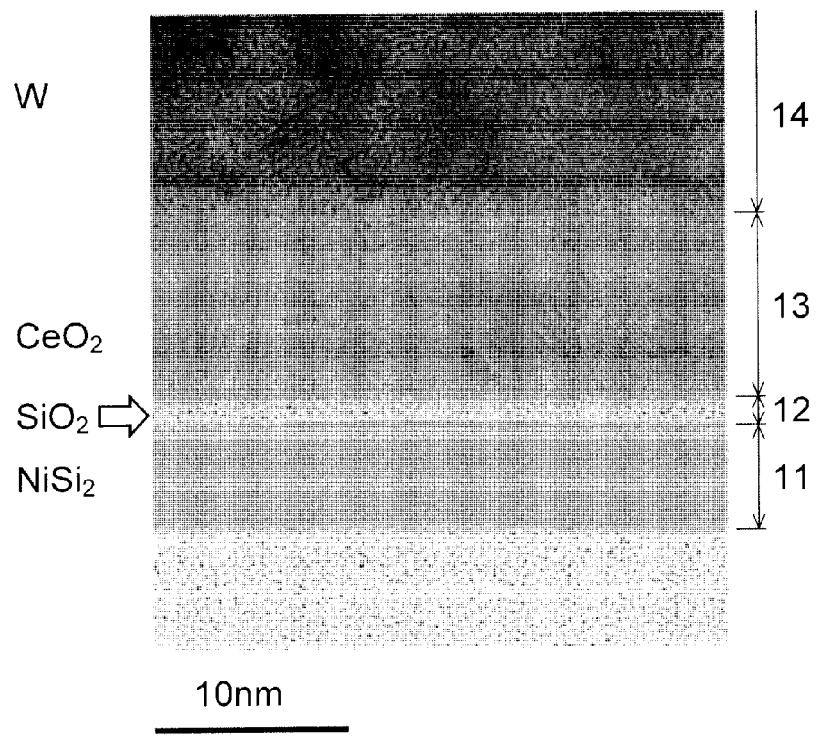
FIG. 9A is a TEM photograph showing a cross section of the sample of the first example.
Figure 9B:
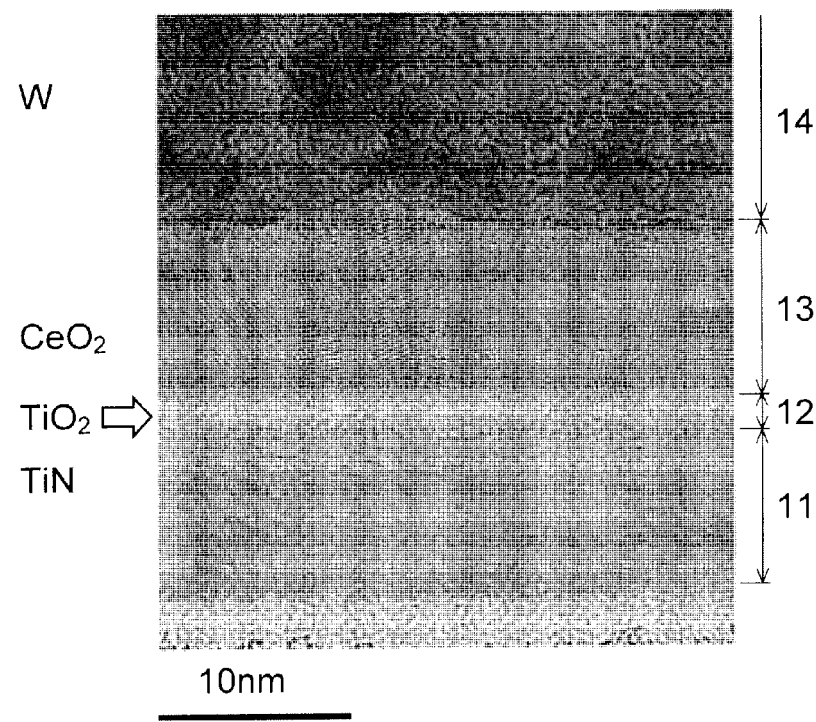
FIG. 9B is a TEM photograph showing a cross section of the sample of the first comparative example.

FIG. 9A is a TEM photograph showing a cross section of the sample of the first example, and FIG. 9B is a TEM photograph showing a cross section of the sample of the first comparative example.

As shown in FIG. 7A, in the first example, nickel disilicide ($NiSi_2$), a cerium oxide ($CeO_2$), and tungsten (W) were deposited in this order by the EB vapor deposition method. The amount of the cerium oxide deposited was set to 20 nm.

Thereby, as shown in FIG. 9A, a layer made of nickel disilicide, a layer made of the cerium oxide, and a layer made of tungsten were stacked in this order. A uniform silicon oxide layer ($SiO_2$) with a thickness of approximately 2 nm was formed between the nickel disilicide layer and the cerium oxide layer. On the other hand, no reaction layer was formed between the cerium oxide layer and the tungsten layer.

This sample was connected to a power supply circuit to measure the I-V characteristics, with the current limiting value (c.c.) at 2 mA. Consequently, as shown in FIG. 7B, a low resistance state and a high resistance state were found, and a clear hysteresis appeared. The ON/OFF ratio was measured with the read voltage at −0.1 V, and a very high ON/OFF ratio of a value more than $1\times10^4$ was obtained. A high ON/OFF ratio of $1\times10^4$ to $1\times10^8$ was able to be kept even when heat treatment was performed on the sample according to the first embodiment in a temperature range of room temperature to 700° C.

The behavior during the first voltage raising, that is, when the voltage was continuously increased from zero on the sample in the initial state for the first time, almost agreed with the behavior during setting, that is, when the voltage was continuously increased from zero for the second or subsequent time. In FIG. 7B, the plotted points indicating the first voltage raising overlap with the plotted points indicating setting. Thus, in the first example, the electric resistance value of the high resistance state returned to the electric resistance value of the initial state, and the behavior of setting was the same as the behavior of the first voltage raising. Thus, forming-free was achieved in the first example.

On the other hand, as shown in FIG. 8A, in the first comparative example, the lower electrode 11 was formed of a titanium nitride (TiN). A cerium oxide ($CeO_2$) and tungsten (W) were deposited thereon in this order. The amount of the cerium oxide deposited was set to 20 nm.

Thereby, as shown in FIG. 9B, a layer made of the cerium oxide and a layer made of tungsten were deposited in this order on a layer made of the titanium nitride. A titanium oxide layer ($TiO_2$) was formed between the titanium nitride layer and the cerium oxide layer. The relative permittivity of the titanium oxide ($TiO_2$) forming the resistance change layer 12 (approximately 40) is higher than the relative permittivity of the cerium oxide ($CeO_2$) forming the oxygen conductive layer 13 (approximately 28).

As shown in FIG. 8B, for the I-V characteristics of the first comparative example, the ON/OFF ratio was approximately $1\times10^2$, and was lower than that of the first example. Furthermore, the setting exhibited a different behavior from the forming, and forming-free was not achieved. This is presumed to be because the relative permittivity of the resistance change layer 12 was higher than the relative permittivity of the oxygen conductive layer 13 and the electric field did not concentrate sufficiently in the resistance change layer 12.

Second Example and Second Comparative Example

Figure 10A:
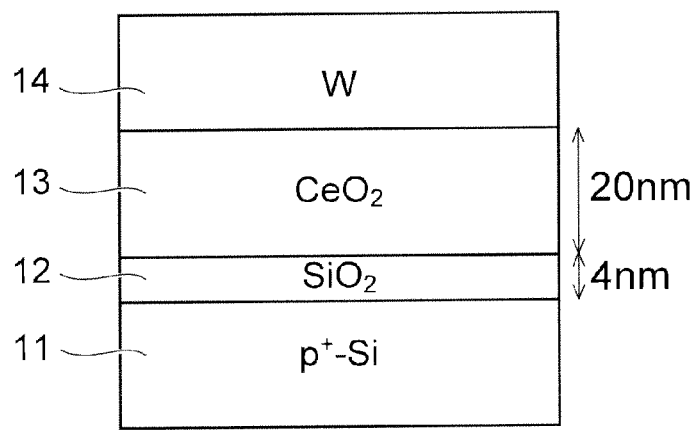
FIG. 10A is a cross-sectional view showing the sample of a second example.
Figure 10B:
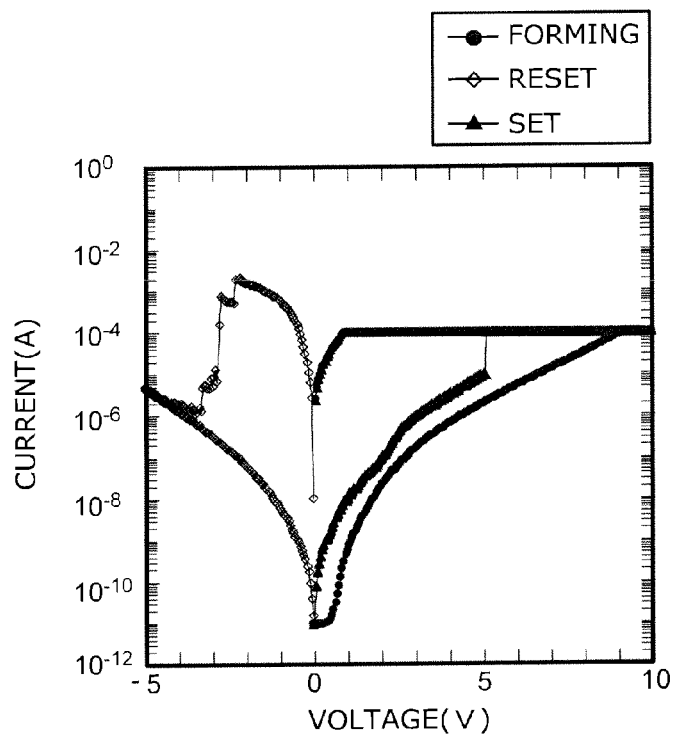
FIG. 10B is a graph showing the I-V characteristics of the sample, with the voltage on the horizontal axis and the current on the vertical axis.

FIG. 10A is a cross-sectional view showing the sample of a second example, and FIG. 10B is a graph showing the I-V characteristics of the sample, with the voltage on the horizontal axis and the current on the vertical axis.

Figure 11A:
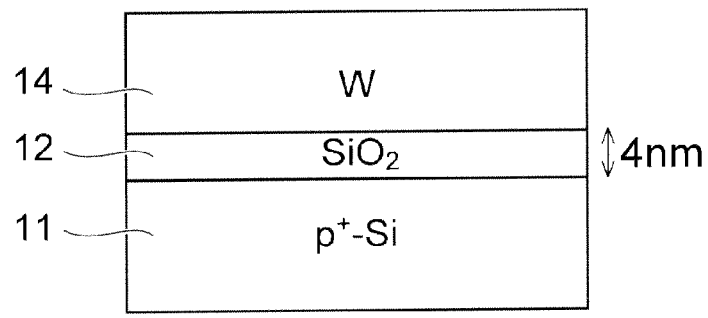
FIG. 11A is a cross-sectional view showing the sample of a second comparative example.
Figure 11B:
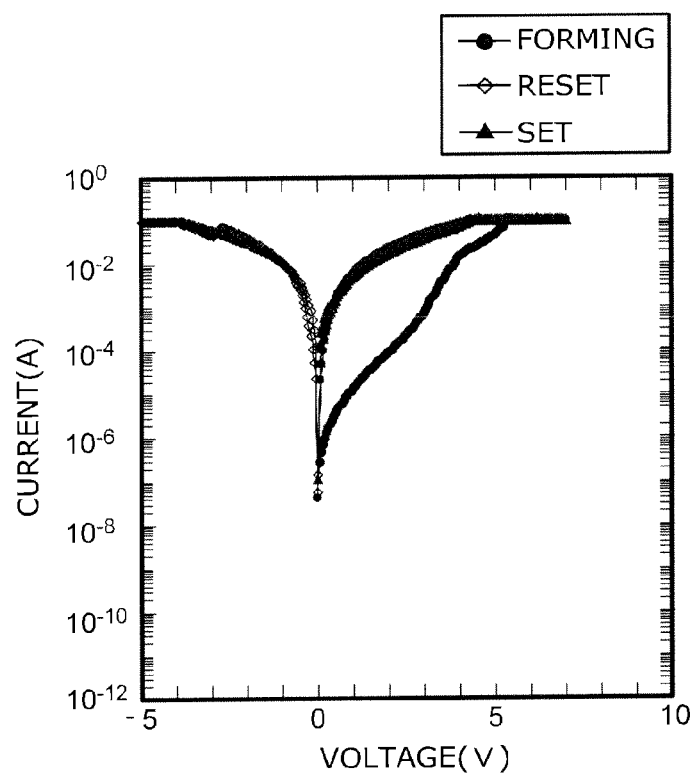
FIG. 11B is a graph showing the I-V characteristics of the sample, with the voltage on the horizontal axis and the current on the vertical axis.

FIG. 11A is a cross-sectional view showing the sample of a second comparative example, and FIG. 11B is a graph showing the I-V characteristics of the sample, with the voltage on the horizontal axis and the current on the vertical axis.

As shown in FIG. 10A, in the second example, a silicon substrate with the conductivity type of the $p^+$-type was prepared as the lower electrode 11, and a thermal oxidation treatment with a temperature of 800° C. was performed; thereby, a silicon oxide layer ($SiO_2$) with a thickness of 4 nm was formed on the upper surface of the silicon substrate. Next, a cerium oxide ($CeO_2$) was deposited with a deposition amount of 20 nm by the EB vapor deposition method, and then tungsten (W) was deposited.

As shown in FIG. 10B, also in the second example, the ON/OFF ratio showed a high value more than $1\times10^4$. This is presumed to be because, at the time of resetting, the lower electrode 11 made of $p^+$-type silicon underwent local anodic oxidation and the dielectric breakdown of the resistance change layer 12 was effectively repaired. Thus, it has been shown that a memory cell with good characteristics can be obtained also when the lower electrode 11 is formed of silicon. It is presumed that a high ON/OFF ratio can be kept even when the sample according to the second example undergoes a heat treatment in a range from room temperature to 700° C., similarly to the first example.

In the second example, the behavior of setting did not completely agree with the behavior of forming, and forming-free was not achieved. This is presumed to be because, at the time of resetting, the dielectric breakdown was not completely repaired due to the large thickness of 4 nm of the $SiO_2$ layer that forms the resistance change layer 12. It is presumed that forming-free would have been able to be achieved if the thickness of the $SiO_2$ layer had been set smaller.

On the other hand, as shown in FIG. 11A, in the second comparative example, a similar method to the second example was used to form a silicon oxide layer ($SiO_2$) with a thickness of 4 nm on the upper surface of a silicon substrate with the conductivity type of the $p^+$-type. Next, a tungsten layer was formed, without forming a cerium oxide layer ($CeO_2$). That is, in the second comparative example, the oxygen supply layer 13 was not provided.

As shown in FIG. 11B, in the second comparative example, the resistance state exhibited only one state, and operation as a memory cell was not obtained.

Third Embodiment

Figure 12A:
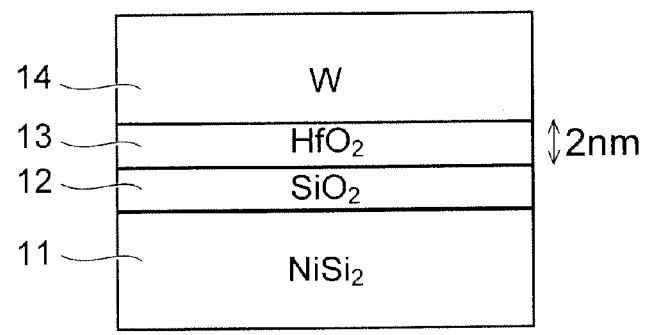
FIG. 12A is a cross-sectional view showing the sample of a third example.
Figure 12B:
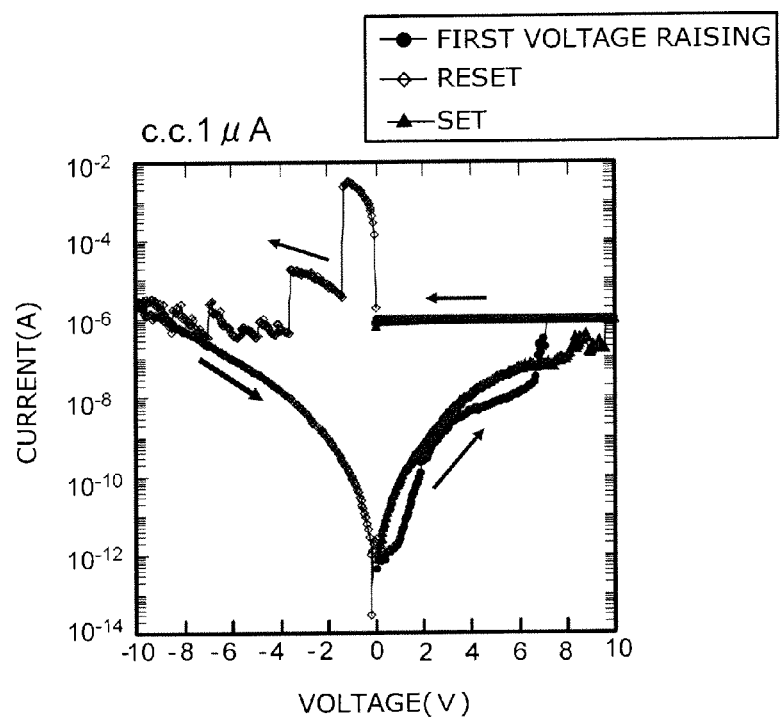
FIG. 12B is a graph showing the I-V characteristics of the sample, with the voltage on the horizontal axis and the current on the vertical axis.

FIG. 12A is a cross-sectional view showing the sample of a third example, and FIG. 12B is a graph showing the I-V characteristics of the sample, with the voltage on the horizontal axis and the current on the vertical axis.

As shown in FIG. 12A, the third example differs from the first example described above in that the oxygen conductive layer 13 is formed of a hafnium oxide ($HfO_2$). The thickness of the hafnium oxide layer was set to 2 nm. Otherwise, the configuration of the third example is similar to the first example. That is, in the third example, the lower electrode 11 was formed of nickel disilicide ($NiSi_2$) and the upper electrode 14 was formed of tungsten (W). A silicon oxide layer ($SiO_2$) was formed between the nickel disilicide layer (the lower electrode 11) and the hafnium oxide layer (the oxygen conductive layer 13).

As shown in FIG. 12B, also in the third example, similar I-V characteristics to the first example were found. The ON/OFF ratio of the third example was $3\times10^7$ when the read potential was set to −0.1 V. Thus, a high ON/OFF ratio was able to be achieved also when the oxygen conductive layer 13 was formed of a hafnium oxide ($HfO_2$). Furthermore, the behaviors of the first voltage raising and the set operation almost agreed, and forming-free was able to be achieved.

Fourth Example

Figure 13A:
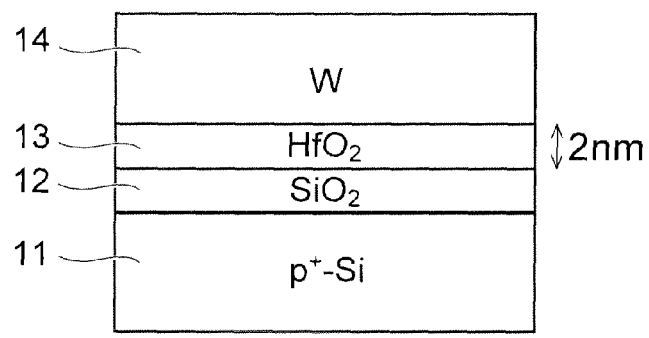
FIG. 13A is a cross-sectional view showing the sample of a fourth example.
Figure 13B:
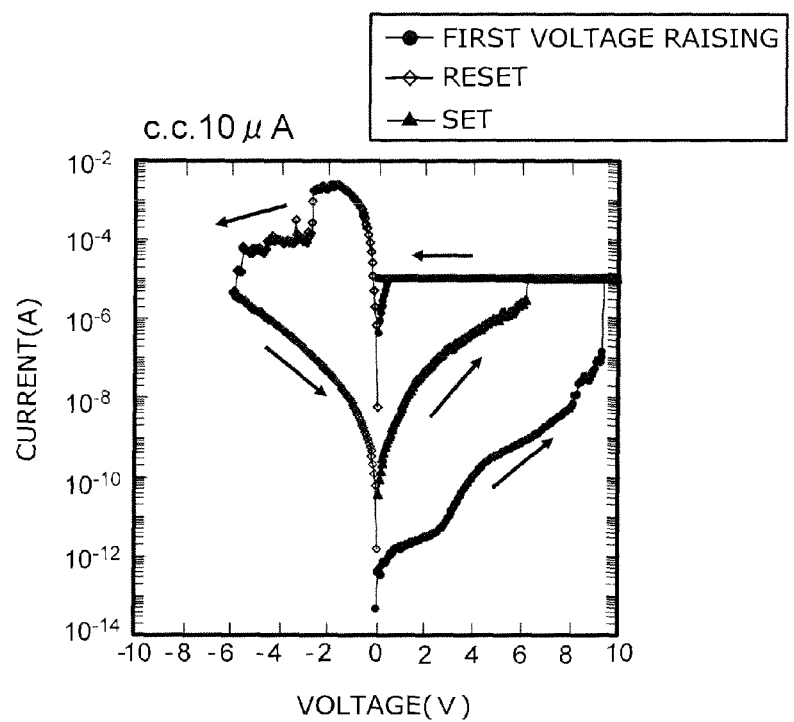
FIG. 13B is a graph showing the I-V characteristics of the sample, with the voltage on the horizontal axis and the current on the vertical axis.
Figure 15:
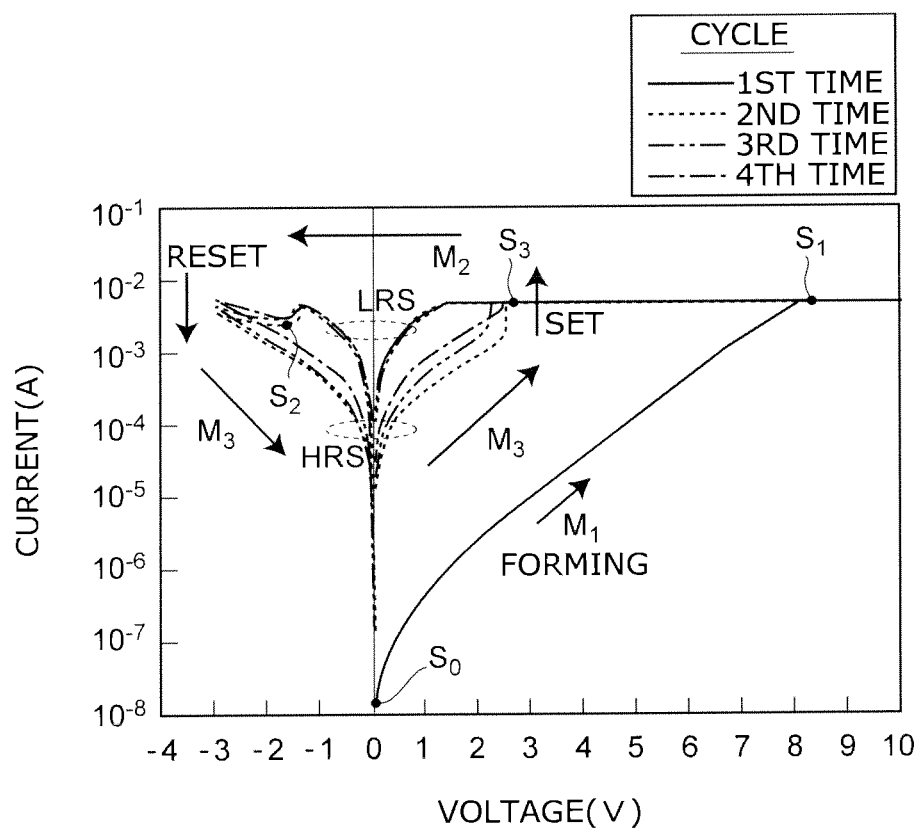
FIG. 15 is a graph illustrating the I-V characteristics of the conventional resistance change memory device, with the voltage on the horizontal axis and the current on the vertical axis.

FIG. 13A is a cross-sectional view showing the sample of a fourth example, and FIG. 13B is a graph showing the I-V characteristics of the sample, with the voltage on the horizontal axis and the current on the vertical axis.

As shown in FIG. 13A, the fourth example differs from the first example described above in that the lower electrode 11 is formed of silicon with the conductivity type of the $p^+$-type and the oxygen conductive layer 13 is formed of a hafnium oxide ($HfO_2$). The thickness of the hafnium oxide layer was set to 2 nm. Otherwise, the configuration is similar to the first example. A silicon oxide layer ($SiO_2$) was formed between the $p^+$-type silicon layer (the lower electrode 11) and the hafnium oxide layer (the oxygen conductive layer 13).

As shown in FIG. 13B, also in the fourth example, similar I-V characteristics to the first example were found. The ON/OFF ratio of the fourth example was $2\times10^5$ when the read potential was set to −0.1 V. Thus, a high ON/OFF ratio was able to be achieved also by the combination of the lower electrode 11 made of $p^+$-type silicon and the oxygen conductive layer 13 made of the hafnium oxide ($HfO_2$). In the fourth example, the behaviors of the first voltage raising and the set operation did not agree, and forming-free was not achieved. This is presumed to be because the thickness of the $SiO_2$ layer that forms the resistance change layer 12 was large.

The embodiment described above illustrates examples in which a material different from the material of the lower electrode 11 is used as the material of the upper electrode 14. However, the invention is not limited thereto, and the material of the upper electrode 14 may be the same as the material of the lower electrode 11. That is, the material of the upper electrode 14 may be an electrically conductive material containing the element that is oxidized contained in the resistance change layer 12, for example a material containing silicon. Thereby, the resistance change layer 12 made of, for example, a silicon oxide is formed also between the upper electrode 14 and the oxygen conductive layer 13, and a multiple-valued operation of a memory cell can be obtained. That is, by two resistance change layers being formed on the upper and lower sides of the oxygen conductive layer 13, four states can be obtained: (1) a state where both resistance change layers 12 are in the low resistance state; (2) a state where only the lower resistance change layer 12 is in the low resistance state; (3) a state where only the upper resistance change layer 12 is in the low resistance state; and (4) a state where both resistance change layers 12 are in the high resistance state. Thus, two-bit information can be stored in one memory cell, for example.

The memory cell described in the above embodiment can be incorporated into a cross-point memory device. For example, in a structure in which a word line interconnection layer including a plurality of word lines extending in the X-direction and a bit line interconnection layer including a plurality of bit lines extending in the Y-direction are alternately stacked along the Z-direction on a silicon substrate on the upper surface of which a drive circuit including the power supply circuit 15 is formed, the memory cell 10 described above may be connected between each bit line and each word line. Thereby, memory cells can be integrated three-dimensionally, and the recording density can be increased. At this time, the lower electrode 11 and the upper electrode 12 described above may be used as the word line and the bit line, respectively, or the word line and the bit line may be provided in addition to the lower electrode 11 and the upper electrode 12. One diode may be connected to each memory cell 10, for example.

The embodiment described above can provide a resistance change memory device with a high ON/OFF ratio.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

INDUSTRIAL APPLICATION

The invention can provide a resistance change memory device with a high ON/OFF ratio.

Explanations of Letters or Numerals

1: a resistance change memory device, 10: a memory cell, 11: a lower electrode, 12: a resistance change layer, 13: an oxygen conductive layer, 14: an upper electrode, 15: a power supply circuit, 16: an oxygen-deficient portion, 17: a current path, 18: an oxygen ion, 19: a silicon oxide, 101: a resistance change memory device, 111: a lower electrode, 112: a resistance change layer, 113: an upper electrode, 114: an oxygen-deficient portion, 115: a power supply circuit, 116: filament, $M_1$, $M_2$, $M_3$: operation, $S_0$, $S_1$, $S_2$, $S_3$: state, $R_1$, $R_2$: region, Z: a curved line

The invention claimed is:

1. A resistance change memory device comprising:
a first electrode containing a first element;
a resistance change layer provided on the first electrode and containing an oxide of the first element;
an oxygen conductive layer provided on the resistance change layer, containing a second element and oxygen, having oxygen ion conductivity, and having a relative permittivity higher than a relative permittivity of the resistance change layer; and
a second electrode provided on the oxygen conductive layer,
configured such that the resistance change layer undergoes dielectric breakdown earlier than the oxygen conductive layer when a voltage between the first electrode and the second electrode is continuously increased from zero.

2. The resistance change memory device according to claim 1, further comprising a power supply circuit configured to apply a voltage between the first electrode and the second electrode,
satisfying the following mathematical formula, $$V_{app} \geq E_{VR}^{BD}\left(t_{VR} + \frac{k_{VR}}{k_{OC}} \times t_{OC}\right)$$

where $V_{app}$ is a voltage that the power supply circuit is capable of outputting, $E_{VR}^{BD}$ is an electric field strength necessary for dielectric breakdown of the resistance change layer, $t_{VR}$ is a thickness of the resistance change layer, $k_{VR}$ is a relative permittivity of the resistance change layer, $t_{OC}$ is a thickness of the oxygen conductive layer, and $k_{OC}$ is a relative permittivity of the oxygen conductive layer.

3. The resistance change memory device according to claim 1, wherein an absolute value of a difference between an electronegativity of the first element and an electronegativity of oxygen is smaller than an absolute value of a difference between an electronegativity of the second element and an electronegativity of oxygen.

4. The resistance change memory device according to claim 1, wherein the resistance change layer is made of a covalently bonded oxide.

5. The resistance change memory device according to claim 1, wherein the first element is silicon.

6. The resistance change memory device according to claim 5, wherein the first electrode is formed of silicon containing an impurity or a metal silicide.

7. The resistance change memory device according to claim 1, wherein the first electrode is formed of a material by which the same kind of material as a material of the resistance change layer is formed by local anodic oxidation.

8. The resistance change memory device according to claim 1, wherein the oxygen conductive layer is made of an ionically bonded oxide.

9. The resistance change memory device according to claim 1, wherein a crystal structure of the oxygen conductive layer is of a fluorite type.

10. The resistance change memory device according to claim 1, wherein the oxygen conductive layer contains one or more oxides selected from the group consisting of a cerium oxide, a hafnium oxide, a zirconium oxide, a titanium oxide, strontium titanate, and yttria stabilized zirconia.

11. The resistance change memory device according to claim 10, wherein the oxygen conductive layer is made of a cerium oxide.

12. The resistance change memory device according to claim 1, wherein the second electrode is formed of a material that does not react with the second element.

* * * * *